United States Patent
Scott et al.

(10) Patent No.: US 12,267,051 B2
(45) Date of Patent: Apr. 1, 2025

(54) POWER AMPLIFIER SYSTEM

(71) Applicant: Qorvo US, Inc., Greensboro, NC (US)

(72) Inventors: Baker Scott, San Jose, CA (US);
George Maxim, Saratoga, CA (US);
Nadim Khlat, Cugnaux (FR); Chong Woo, Fremont, CA (US); Jungmin Park, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 596 days.

(21) Appl. No.: 17/587,368

(22) Filed: Jan. 28, 2022

(65) Prior Publication Data
US 2023/0246609 A1    Aug. 3, 2023

(51) Int. Cl.
*H03F 1/32*    (2006.01)
*H03F 1/56*    (2006.01)
*H03F 3/24*    (2006.01)

(52) U.S. Cl.
CPC .............. *H03F 3/245* (2013.01); *H03F 1/565* (2013.01); *H03F 2200/222* (2013.01); *H03F 2200/451* (2013.01)

(58) Field of Classification Search
CPC ..................................... H03F 1/32; H03F 1/12
USPC ............................................. 330/126, 51, 311
See application file for complete search history.

(56) References Cited

U.S. PATENT DOCUMENTS

| | | | | |
|---|---|---|---|---|
| 6,812,786 B2 * | 11/2004 | Jackson | ............... | H03F 3/60 330/51 |
| 10,298,187 B2 * | 5/2019 | Goldblatt | ............. | H03K 17/693 |
| 11,671,135 B2 * | 6/2023 | Shrivastava | ............. | H04B 1/40 455/73 |
| 2018/0048273 A1 | 2/2018 | Goldblatt | | |

FOREIGN PATENT DOCUMENTS

| | | |
|---|---|---|
| EP | 2949042 A2 | 6/2019 |
| WO | 2018118344 A1 | 6/2018 |

OTHER PUBLICATIONS

Extended European Search Report for European Patent Application No. 23153117.9, mailed Jun. 21, 2023, 14 pages.

* cited by examiner

*Primary Examiner* — Henry Choe
(74) *Attorney, Agent, or Firm* — Withrow & Terranova, P.L.L.C.

(57) ABSTRACT

A power amplifier system is disclosed having a first amplifier with a high-power input and a high-power output. A second amplifier has a low-power input and a low-power output. A reconfigurable mode switch network has a first series switch branch coupled between the high-power output and an RF output, a first shunt branch is coupled between the RF output and a fixed voltage node, and a second series switch branch is coupled between the low-power output and a shared node of the first shunt branch. The shared node separates the first shunt branch into a first shared section that is between the RF output and the shared node and a second shared section that is between the shared node and the fixed voltage node.

27 Claims, 7 Drawing Sheets

POWER AMPLIFIER SYSTEM

FIELD OF THE DISCLOSURE

Embodiments of the present disclosure relate to radio frequency (RF) communication systems that include power amplifiers and switches used to selectively control transfer of amplified RF power to an RF output.

BACKGROUND

A power amplifier system needs to provide good efficiency not only at high output power levels (e.g., 30 dBm) but also at moderate power (e.g., 15 dBm) and low power levels (e.g., 0 to 5 dBm). This is not easy to achieve with a standard power amplifier configuration. Most existing bipolar power amplifiers—gallium arsenide (GaAs), silicon germanium (SiGe), gallium nitride (GaN), for example—use a variable supply coming from a direct current-to-direct current (DC-DC) converter to move the load line and thus achieve high efficiency over a high-power level range.

In a high-power mode of 20 dBm to 30 dBm and beyond, the power supply voltage VCC is large, greater than 3 V, and the load current is also large, in hundreds of milliamperes and into several amperes. This results in DC-DC converter efficiencies greater than 90%. Typical efficiencies of modern converters are 93% to 95%.

For mid-power levels in the teens of decibel-milliwatts, the VCC is in the 1.2 V to 2 V or 2.5 V range, while the current is still in the 100 mA range or many tens of milliamperes. Still in this case, the DC-DC converter efficiency is in 80% range.

The issue for the low-power mode of around 0 dBm to 5 dBm is that the supply voltage needs to be lowered below 1 V, many times as low as 0.6 V, while the current is in the few tens of milliamperes. In such conditions the efficiency of the DC-DC converter goes below 50% and in low current cases can get even in the 25% range. Although scaling down the voltage from the DC-DC converter helps the efficiency, the DC-DC converter efficiency starts to become a significant limit in how low the equivalent current can be brought. Thus, a new power amplifier system architecture is needed for increasing efficiency for the low power mode. This is especially true with fifth generation (5G) technology because 5G handset transmitters spend more and more time in low-power mode. This makes the low-power mode performance equally important with the performance in the high-power mode. Moreover, a compact and low-cost solution that reduces or eliminates an amount of die area that includes power amplifiers configured for different output ranges such as lower power ranges between 0 dBm and 15 dBm and higher power ranges between just above 15 dBm and 32 dBm is needed.

SUMMARY

A power amplifier system is disclosed having a first amplifier with a high-power input and a high-power output. A second amplifier has a low-power input and a low-power output. A reconfigurable mode switch network has a first series switch branch coupled between the high-power output and an RF output, a first shunt branch is coupled between the RF output and a fixed voltage node, and a second series switch branch is coupled between the low-power output and a shared node of the first shunt branch. The shared node separates the first shunt branch into a first shared section that is between the RF output and the shared node and a second shared section that is between the shared node and the fixed voltage node.

The disclosure further provides a reconfigurable input impedance matching network coupled between an RF input, the first input of the first amplifier, the second input of the second amplifier, and a fixed voltage node, wherein the reconfigurable input impedance matching network is digitally controllable to provide selectable shared input impedance matching for both the first amplifier and the second amplifier In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
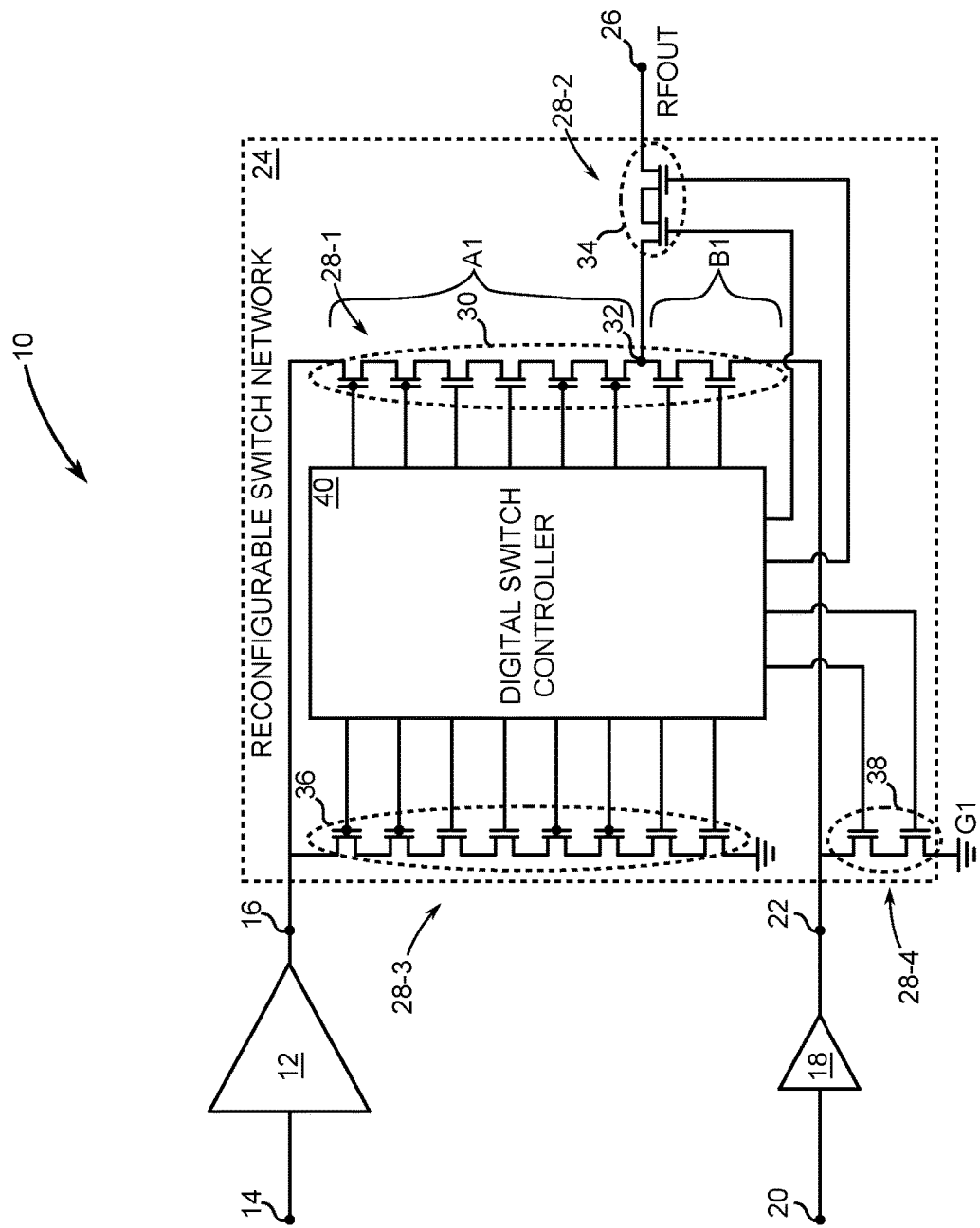
FIG. 1 is a schematic depicting a first exemplary embodiment of a power amplifier system having a reconfigurable switch network that is structured in accordance to the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to the use of a dedicated complementary metal oxide semiconductor (CMOS) power amplifier low-power path that reuses the shunt switch of the main high-power path as the series switch for the low-power path. In this way the extra switch for the low power comes at virtually no additional cost or die area in the mode switch. The input matching network is shared between the high-power and low-power paths using an auxiliary switch network. Both shunt and series impedance matchings can be reconfigured from the high-power network. Furthermore, such dedicated low-power power amplifier operated at high supply voltage and low current provides output impedance close to the 50 Ohms and thus does not require an output matching network or needs a network with very small impedance transformation, which can be implemented with less insertion loss and thus higher efficiency. The input capacitance of the low-power power amplifier can be equalized over all segment combinations using an input capacitor digital-to-analog converter, which keeps the input capacitance approximately constant and thus does not substantially move the power amplifier input match. This dedicated low-power CMOS power amplifier configuration can be combined with a hybrid CMOS-bipolar power amplifier for the high-power path, allowing a dual chip implementation. Such architecture also allows an easy implementation of an input multiplexer that provides two or more radio frequency inputs to the transmit path.

FIG. 1 is a schematic depicting a generalized first exemplary embodiment of a power amplifier system 10 that includes a first amplifier 12 having a first input 14 and a first output 16, and a second amplifier 18 with a second input 20 and a second output 22. The power amplifier system 10 also includes a reconfigurable switch network 24 coupled between the first output 14, the second output 22, a fixed voltage node G1, and a radio frequency (RF) output 26. In the exemplary embodiments, the fixed voltage node G1 is ground. In the exemplary embodiments, the reconfigurable switch 24 has a plurality of switch branches 28 and at least a first one 28-1 of the plurality of switch branches 28 is made up of a first plurality of transistors 30 stacked in series around an node 32 to which a second one 28-2 of the plurality of switch branches 28 is coupled.

In FIG. 1, the first one 28-1 of the plurality of switch branches 28 is coupled between the first output 16 of the first amplifier 12 and the second output 22 of the second amplifier 18. The second one 28-2 of the plurality of switch branches 28 is a series branch coupled between the internal node 32 and the RF output 26. As depicted in the exemplary embodiment FIG. 1, the reconfigurable switch network 24 also includes a third one 28-3 of the plurality of switch branches 28 that is coupled between the first output 16 and the fixed voltage node G1. A fourth one 28-4 of the plurality of switch branches 28 is coupled between the second output 22 and the fixed voltage node G1. In the exemplary embodiment, the second one 28-2 of the plurality of switch branches 28 is made up of a second plurality of transistors 34 that are stacked in series. Also, the third one 28-3 of the plurality of switch branches 28 is made up of a third plurality of transistors 36 that are stacked in series. Moreover, the fourth one 28-4 of the plurality of switch branches 28 is made up of a fourth plurality of transistors 38 that are stacked in series. Further included in this exemplary embodiment is a digital switch controller 40 that is configured to independently turn off and on each one of the plurality of switch branches 28 by applying control signals to gates of the first plurality of transistors 30, the second plurality of transistors 34, the third plurality of transistors 36, and the fourth plurality of transistors 38. The digital switch controller 40 is further configured to switch on and off a first section A1 of the first plurality of transistors 30 on one side of the internal node 32 and independently switch on and off a second section B1 of the first plurality of transistors 30 on an opposed side of the internal node 32. An advantage of this embodiment and of the embodiments that follow is that combining the main high-power and the low-power/mid-power power amplifier paths using shared reconfigurable series and shunt switches results in reduced die area and cost. This disclosed combining results in a compact and low-cost solution that reduces or eliminates the die area typically needed for the auxiliary low-power/mid-power path. The first plurality of transistors 30, the second plurality of transistors 34, the third plurality of transistors 36, and the fourth plurality of transistors 38 are typically field-effect transistors (FETS). A control input of the FETs (i.e., gate) is voltage mode, and thus the FETs can be easily switched at their respective gate without affecting the signal path significantly.

Figure 2:
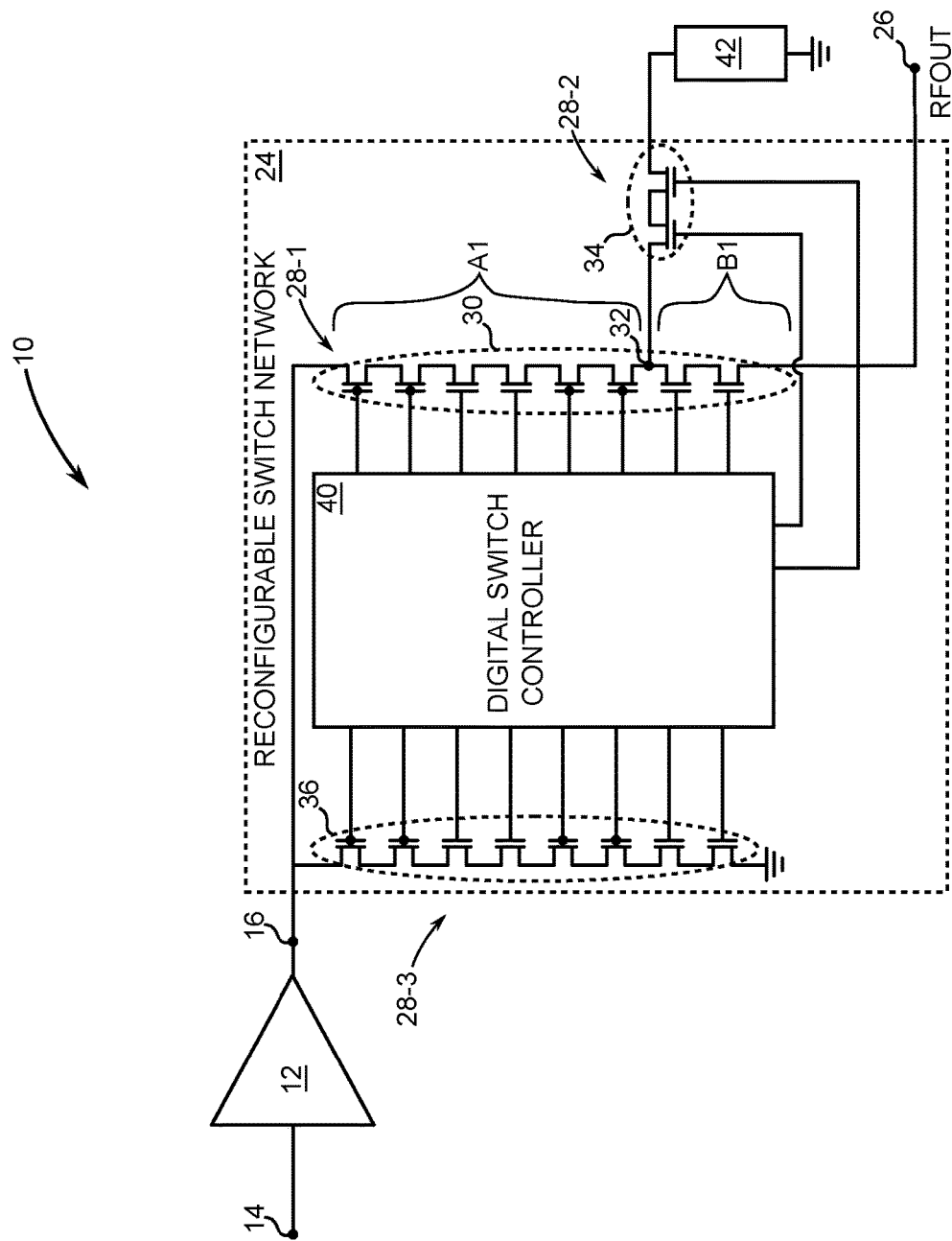
FIG. 2 is a schematic depicting a second embodiment of the power amplifier system having a modified version of the reconfigurable switch network of FIG. 1.

FIG. 2 is a schematic depicting a generalized second embodiment of the power amplifier system 10. In this second exemplary embodiment, the reconfigurable switch network 24 has the first one 28-1 of the plurality of switch branches 28 coupled between the first output 16 and the RF output 26. The second one 28-2 of the plurality of switch branches 28 is a shunt branch that is coupled between the internal node 32 and the fixed voltage node G1 by way of a termination impedance element 42. The termination impedance element 42 may be a resistor, a capacitor, or an inductor, or any combination thereof, including microstrips. Similar to the first exemplary embodiment of FIG. 1, the digital switch controller 40 in the second embodiment also controls the independent turning off and on of each of the plurality of switch branches 28. Moreover, as in the first embodiment, the digital switch controller 40 is further configured to independently switch on and off the first section A1 and the second section B1 of the first plurality of transistors 30 that make up the first one 28-1 of the plurality of switch branches 28.

Figure 3:
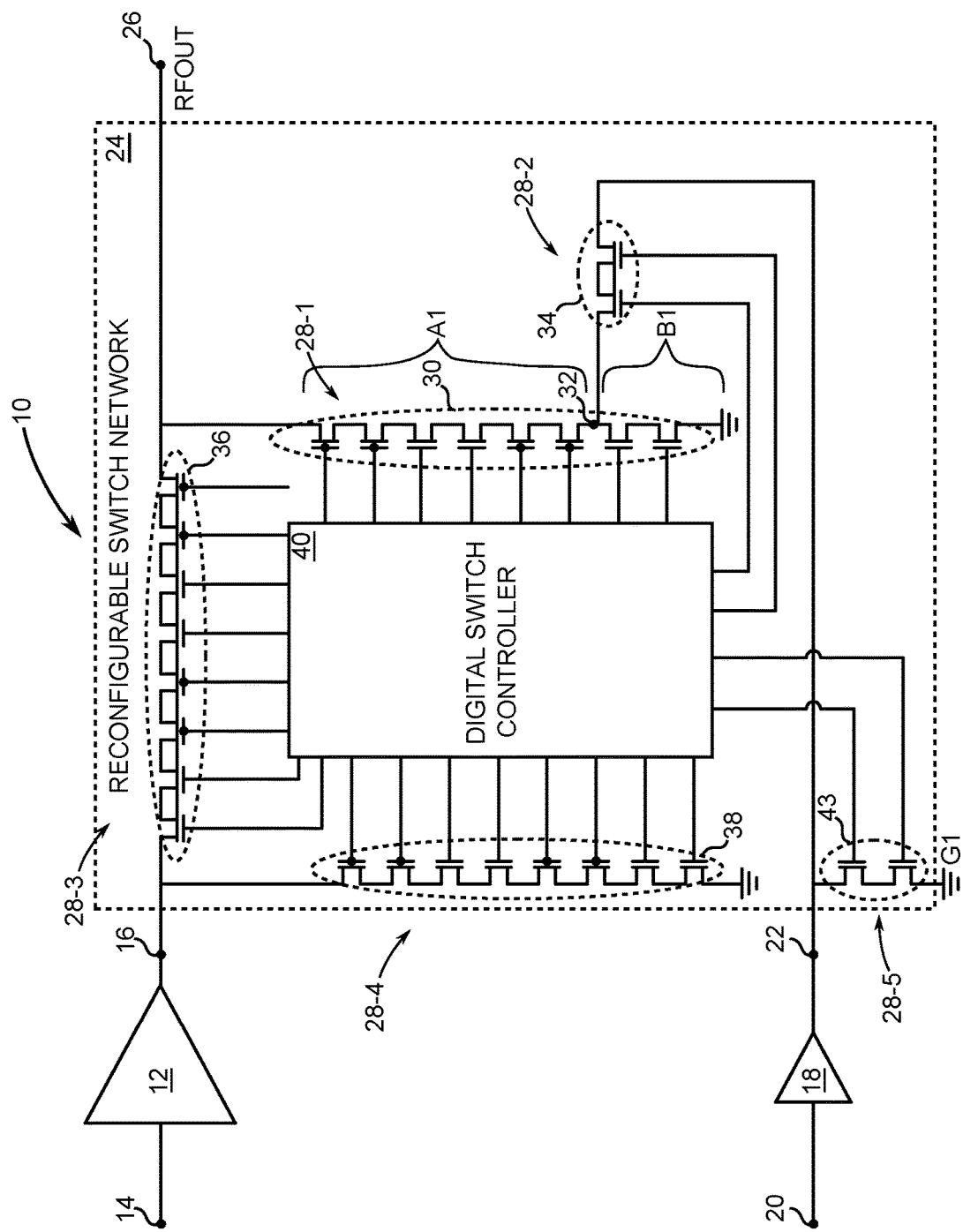
FIG. 3 is a schematic depicting a third embodiment of the power amplifier system having another modified version of the reconfigurable switch network of FIG. 1.

FIG. 3 is a schematic depicting a generalized third embodiment of the power amplifier system 10. In this third exemplary embodiment, the reconfigurable switch network 24 has the first one 28-1 of the plurality of switch branches 28 coupled as a shunt branch between the RF output 26 and the fixed voltage node G1. The second one 28-2 of the plurality of switch branches 28 is coupled as a series branch between the second output 22 and the internal node 32. The third one 28-3 of the plurality of switch branches 28 is coupled between the first output 16 and the RF output 26. The fourth one 28-4 of the plurality of switch branches 28 is coupled between the first output 16 and the fixed voltage node G1. A fifth one 28-5 of the plurality of switch branches 28 is coupled between the second output 22 and the fixed voltage node G1. The fifth one 28-5 of the plurality of switch branches 28 comprises a fifth plurality of transistors 43. Similar to the first and second exemplary embodiments of FIG. 1 and FIG. 2, the digital switch controller 40 in the third embodiment also controls the independent turning off and on of each of the plurality of switch branches 28. Moreover, as in the first embodiment, the digital switch controller 40 is further configured to independently switch on and off the first section A1 and the second section B1 of the first plurality of transistors 30 that make up the first one 28-1 of the plurality of switch branches 28.

Figure 4:
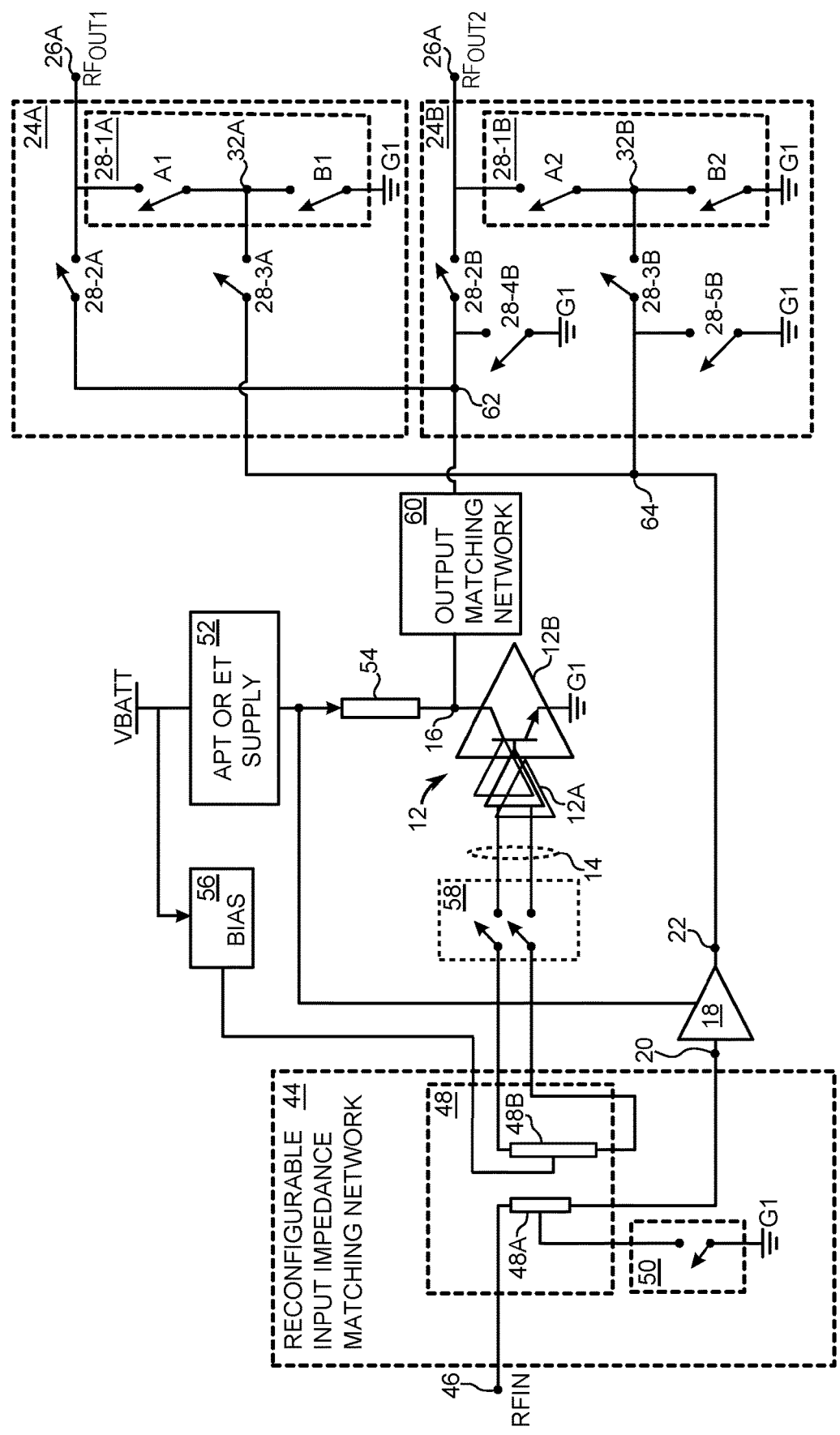
FIG. 4 is a schematic depicting fourth embodiment of the power amplifier system that further includes a reconfigurable input impedance matching network.

FIG. 4 is a schematic depicting a fourth embodiment of the power amplifier system 10. This fourth embodiment includes a reconfigurable input impedance matching network 44 coupled between an RF input 46, the first input 14 of the first amplifier 12, the second input 20 of the second amplifier 18, and the fixed voltage node G1, wherein the reconfigurable input impedance matching network 44 is digitally controllable to provide selectable shared input impedance matching for both the first amplifier 12 and the second amplifier 18. An advantage of this embodiment is that the reconfigurable input matching network 44 is shared while retaining the high performance for both the high-power and the low-power paths. In this particular case, the reconfigurable input impedance matching network 44 has an impedance transformer 48 having a tapped primary 48A and a tapped secondary 48B. In general, an input match may comprise of one or multiple inductors and/or a transformer with two or more windings. The input match is usually optimized for the high-power path, which is the main mode of operation for the transmitter. Note that if a balun is used in the input match, one of its windings can be reconfigured to create the low-power mode matching network, while maintaining isolation between the high-power and low-power paths.

A grounding switch 50 is coupled between a tap of the tapped primary 48A and the fixed voltage node G1. When the grounding switch 50 is closed, the reconfigurable input impedance matching network 44 is configured to input impedance match the first amplifier 12. In contrast, when the grounding switch 50 is open, the reconfigurable input impedance matching network 44 is configured to input impedance match the second amplifier 12. In other words, when the grounding switch 50 is open, the tapped primary 48A is reused to input impedance match the second amplifier 18. As such, the reconfigurable input impedance matching network 44 is shared between the first amplifier 12 and the second amplifier 18. This embodiment discloses an architecture for both mode switching and input matching for the power amplifier system 10 that realizes a multi-mode power amplifier in which the size and the cost is reduced via re-use and reconfiguration. The portion A1 of the shunt switch branch 28-1A of the main high-power path is re-used as the series switch of the low-power/mid-power path.

In this fourth exemplary embodiment, the first amplifier 12 is a higher power amplifier than the second amplifier 18. In this exemplary case, the first amplifier 12 has a driver stage 12A and an output stage 12B. Both the first amplifier 12 and the second amplifier 18 are powered by an average power tracking (APT) or envelope tracking (ET) supply 52 that receives raw power from a battery VBATT.

A collector impedance 54 is coupled between the APT or ET supply 52 and the first output 16. Bias for the first amplifier 12 is provided by a bias network 56 coupled to a tap of the tapped secondary 48B. An isolation switch 58 may be added at the first input 16 of the first amplifier 16. The isolation switch 58 is opened when the first amplifier 12 is not in operation.

An output impedance matching network 60 is coupled between the first output 16 of the first amplifier 12 and a high power input 62 of a first reconfigurable switch network 24A and a second reconfigurable reconfigurable switch network 24B. The switch branches 28 are shown as symbolic switches, but they are made up of transistors stacked in series. The second output 22 of the second amplifier 18 may be directly coupled to a low power input 64. In other words, unlike a high-power path between the first output 16 and the high power input 62, a low-power path between the second output 22 and the low power input 64 has no output impedance matching or at most a substantially minimal output impedance matching.

Figure 5:
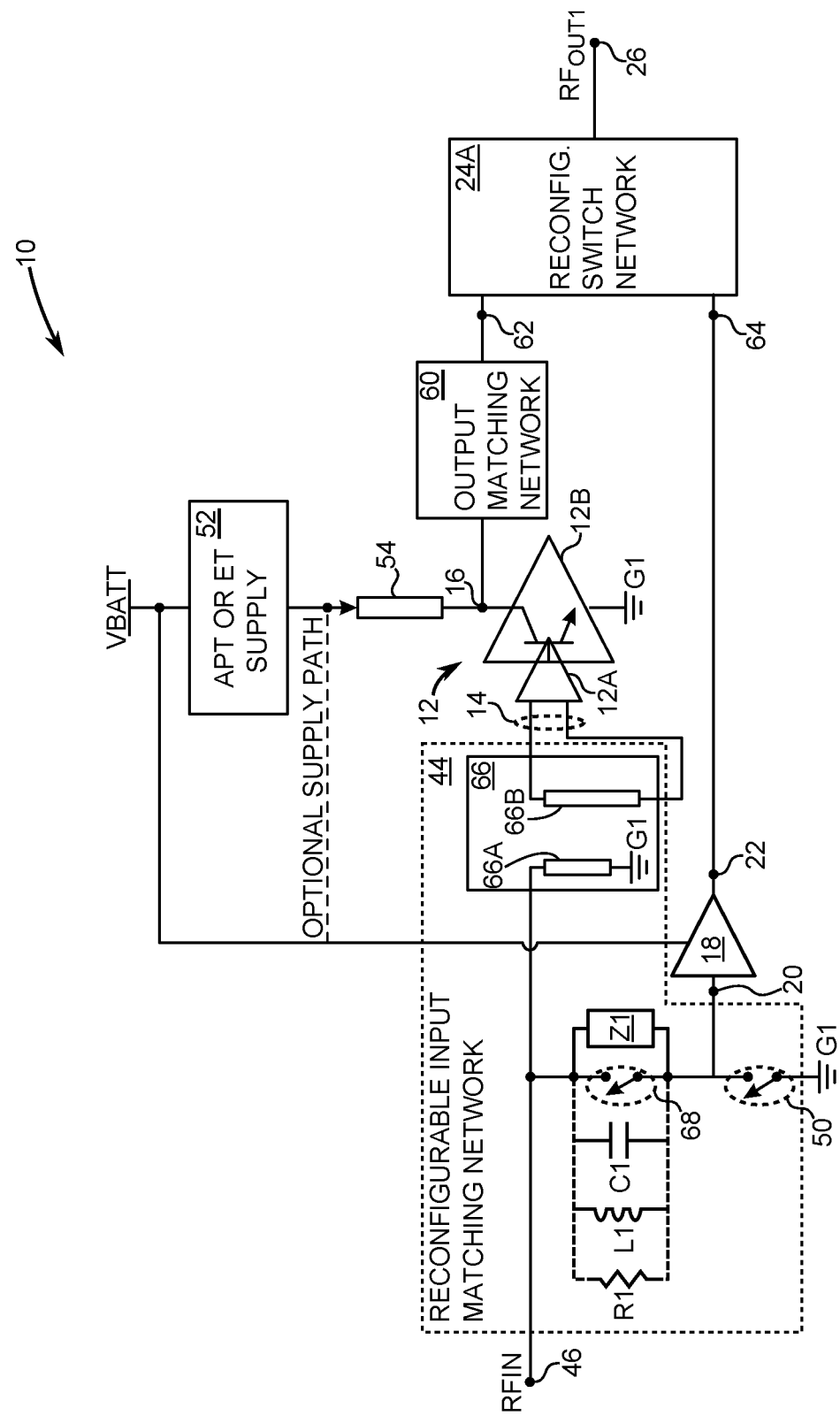
FIG. 5 is a schematic depicting a fifth embodiment of the power amplifier system 10 showing the reconfigurable input matching network fabricated from passive components and switches.

FIG. 5 is a schematic of a fifth embodiment of the power amplifier system 10. In particular, FIG. 5 shows the reconfigurable input matching network 44 with passive components and switches. Combining the high-power and low-power paths without using switches, although possible, usually results in non-sufficient isolation between the two paths and thus degrades performance. In this fifth embodiment, the first amplifier 12 and the second amplifier 18 have a shared input impedance matching transformer 66 that has a primary 66A coupled between the RF input 46 and the fixed voltage node G1. A secondary 66B is coupled across the first input 14, which in this exemplary case is a differential input. At least one impedance matching element Z1 is effectively removable by way of at least one shorting switch 68, which is typically a digitally controllable transistorized switch. In this exemplary case, the impedance matching element Z1 is coupled between the RF input 46 and the second input 20 of the second amplifier 18. The impedance matching element Z1 may be any one of a capacitor C1, an inductor L1, a resistor R1, and combinations thereof.

Figure 6:
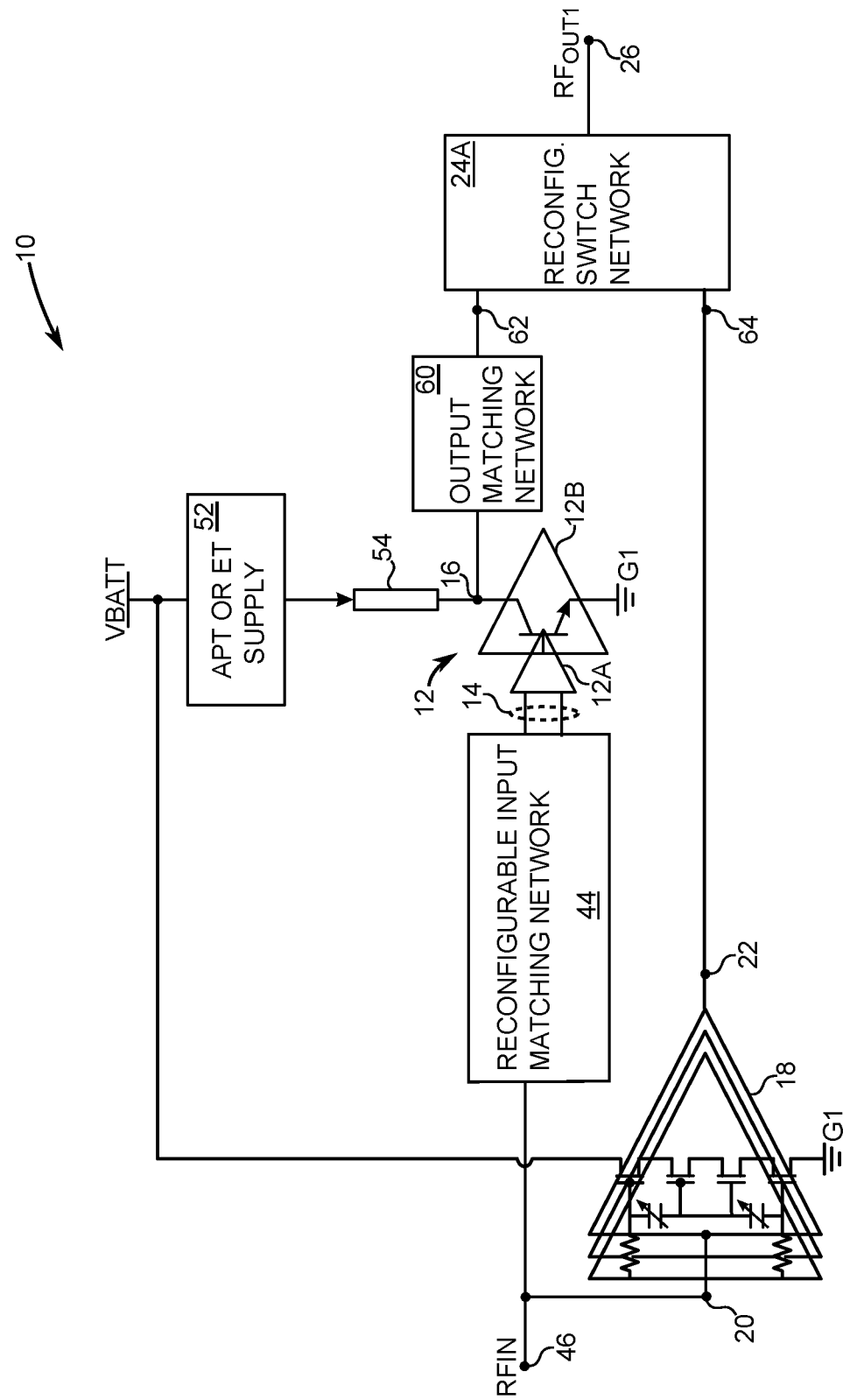
FIG. 6 is a schematic of a sixth embodiment of the power amplifier system in which a second amplifier is a segmented amplifier that is powered directly from a battery source.

FIG. 6 is a schematic of a sixth embodiment of the power amplifier system 10. In this sixth embodiment, the second amplifier 18 is a segmented amplifier and is powered directly from the battery source VBATT to reduce current draw during lower power requirement situations. The lower power path between the second output 22 and the RF output 26 has no need for an output impedance matching network, thus the lower power path is dedicated to high efficiency operation. In general, CMOS power amplifier stages can easily be mixed with switches to create the segmented power amplifier architecture of FIG. 6. In this sixth embodiment, the current is adjusted by large multiplication factors via switching in and out different segments. Such segmented CMOS power amplifier stage can still achieve good efficiency over wider power range while operating from a constant supply voltage, such as VBATT.

A single power amplifier path can be used for a wide power level including high power, mid power, and low power. While the battery of a mobile device such as a cellphone provides voltages around 3.5 V, a buck-boost DC-DC converter can generate a local power supply voltage (VCC) that can be varied from low voltages (e.g., VCC=0.6 V) up to higher voltages that can go above the battery voltage (VBATT) value (e.g., VCC=3.8 V, 4.2 V, and 4.7 V).

Reducing the VCC of the power amplifier stages allows for achieving a desirable efficiency at significant power back-off levels. Only the output stage of the power amplifier may use a variable DC-DC converter-generated supply, or both (all) stages may be biased from the variable DC-DC converter-generated VCC. The supply converter may be an APT type or an ET type.

The supply current of the low-power power amplifier comes directly from the VBATT and thus does not take advantage of supply voltage modulation. A fixed supply power amplifier cannot achieve high efficiency for a wide power level range. In the general case the low-power power amplifier path may use its own input matching network. However, such network takes additional area and thus increases the cost of the solution and the footprint area.

An alternative solution is to share the input match between the high-power and the low-power signal paths, reducing the area and cost. Radio frequency switches can be used to multiplex the high-power and low-power paths while sharing the input matching network. The switching network may include capacitors that can adjust the impedance level for such different power levels.

The CMOS power amplifier stages can easily be mixed with switches to create the segmented power amplifier architecture of this embodiment in which the current is adjusted by large multiplication factors via switching in and out different segments. Such segmented CMOS power amplifier stage can still achieve good efficiency over wider power range while operating from a constant supply voltage, such as VBATT.

The variation of the input capacitance with the segmentation can be compensated by adding variable capacitors with opposite direction, which keeps a constant input capacitance with different segment counts.

Figure 7:
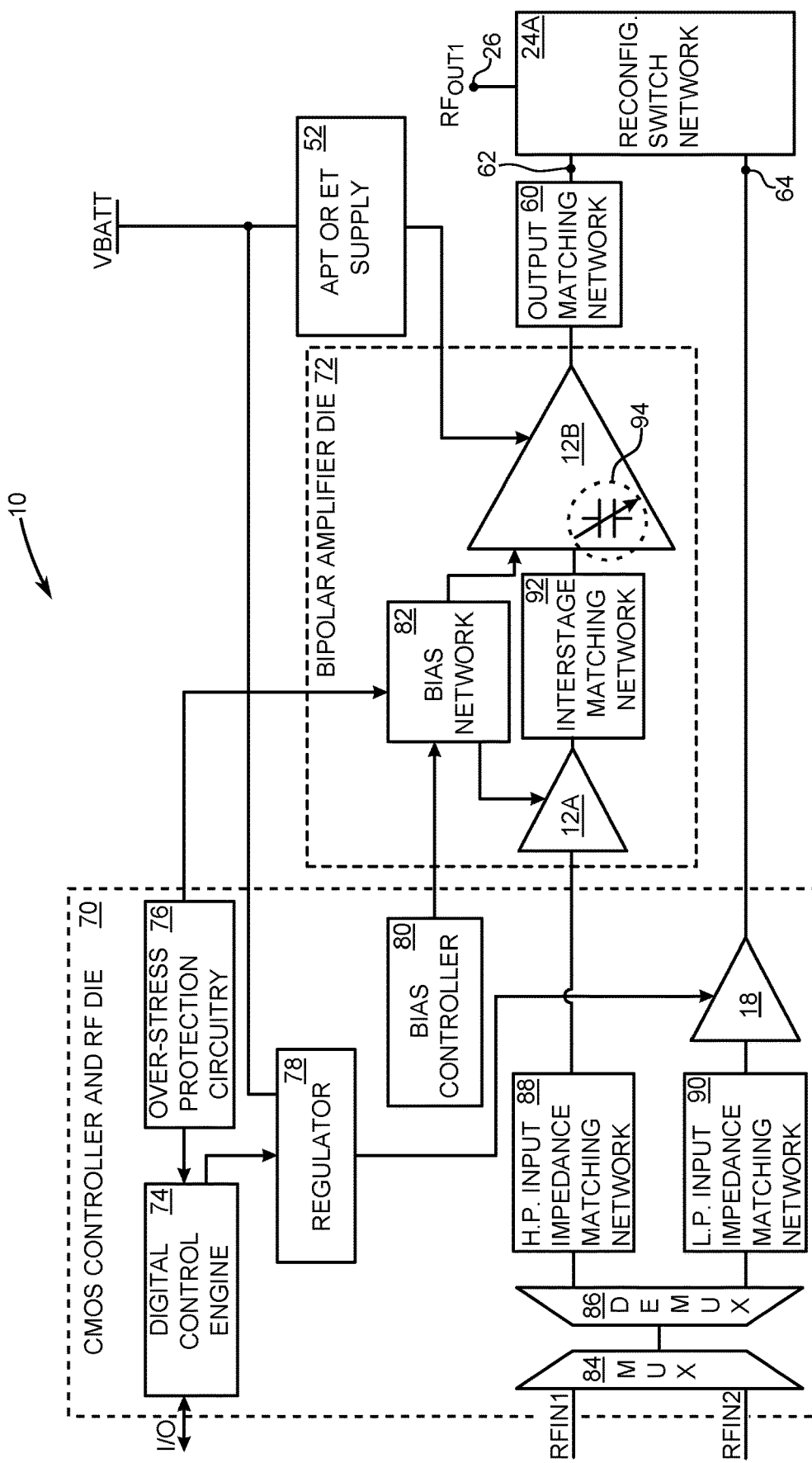
FIG. 7 is a schematic of a seventh embodiment of the power amplifier system in which the second amplifier is a lower power amplifier and is integrated into a complementary metal oxide semiconductor (CMOS) controller and radio frequency (RF) driver die.

FIG. 7 is a schematic of a seventh embodiment of the power amplifier system 10. In this exemplary embodiment, the second amplifier 18 is a lower power amplifier and is integrated into a CMOS controller and RF driver die 70. The first amplifier 12 is a higher power amplifier and is integrated into a bipolar amplifier die 72 based on GaAs technology, for example. The CMOS controller and RF driver die 70 includes digital control engine 74 that includes a input/output (I/O) line that allows the digital control engine 74 to communicate with external processors (not shown). Over-stress protection circuitry 76 monitors the thermal stress of the bipolar amplifier die 72 and is interfaced with the digital control engine 74 to report over-stress conditions to the digital control engine 74. A regulator 78 for regulating a supply voltage to the second amplifier 18 is also integrated into the CMOS controller and RF driver die 70. Further integrated is a bias controller 80 that is configured to control a bias network 82 that is integrated into the bipolar amplifier die 72. The bias network 82 is controlled by both the over-stress protection circuitry 76 and the bias controller 80. A signal multiplexer 84 and a signal de-multiplexer 86 are coupled back-to-back between both of the first input 14 and the second input 20 and both of a first RF signal input RFIN1 and a second RF signal input RFIN2. In this configuration, the signals arriving either of the first RF signal input RFIN1 or the second RF signal input RFIN2 can be routed to either the higher power path that includes the first amplifier 12 or the lower power path that includes the second amplifier 18. In this seventh exemplary embodiment, a high power input impedance matching network 88 may be coupled in the high-power path before the first amplifier 12, and a low power input impedance matching network 90 may be coupled in the low-power path before the second amplifier 18. An inter-stage matching network 92 is coupled between the driver stage 12A and the output stage 12B. A power-dependent capacitor 94 may be integrated with the output stage 12B to maintain an input capacitance level over a wide power range to help maintain gain linearity.

To achieve desired gain at radio frequencies, nanometer (nm) CMOS processes can be used, for example, 65 nm.

Nanometer FETs cannot stand the large battery voltages, such as 3.0 V and 3.5 V. Therefore, cascode architectures need to be used for protecting the devices. Having a front-end CMOS chip such as this seventh embodiment allows an easy implementation of an input multiplexer with two or more inputs, as it is required by many modern front-end modules.

Bipolar power amplifiers operating at low supply voltage to achieve desirable efficiency at low power levels have a relatively low output impedance that requires a high impedance transformation output match network. The loss of the power amplifier output match generally increases with the impedance transformation ratio.

In contrast, a CMOS amplifier, for example, a cascoded complementary CMOS power amplifier stage, that operates from a high supply voltage (around 3 V) and provides a relatively low load current has a higher impedance level, close to the 50 Ohm of the load. In such a case, very little or no impedance transformation output matching network is needed. In such cases, the matching network needs only to provide some phase shifting for the largely capacitive output of the power amplifier stage. Therefore, the insertion loss in the of the low-power power amplifier has a much lower loss, improving the efficiency of the dedicated CMOS low-power path, in comparison with the APT or ET bipolar solution.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein. For example, in any of the disclosed embodiments, the second amplifier 18 may be implemented with bipolar/heterojunction bipolar transistors or gallium arsenide, silicon, silicon germanium, gallium nitride, or even CMOS or bipolar CMOS (BiCMOS) that uses a dedicated CMOS low-power power amplifier path biased directly from the battery and using controlled segmentation to achieve high efficiency at low power levels.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
a first amplifier having a first input and a first output;
a second amplifier having a second input and a second output; and
a reconfigurable switch network coupled between the first output, the second output, a fixed voltage node, and a radio frequency (RF) output, the reconfigurable switch network comprising a plurality of switch branches, wherein at least a first one of the plurality of switch branches comprises a first plurality of transistors stacked in series around an internal node to which a second one of the plurality of switch branches is coupled, wherein:
the first one of the plurality of switch branches having the first plurality of transistors stacked around the internal node is coupled between the first output and the second output; and
the second one of the plurality of switch branches is a series branch coupled between the internal node and the RF output.

2. The power amplifier system of claim 1 wherein:
a third one of the plurality of switch branches is coupled between the first output and the fixed voltage node; and
a fourth one of the plurality of switch branches is coupled between the second output and the fixed voltage node.

3. The power amplifier system of claim 2 wherein:
the second one of the plurality of switch branches comprises a second plurality of transistors stacked in series;
the third one of the plurality of switch branches comprises a third plurality of transistors stacked in series; and
the fourth one of the plurality of switch branches comprises a fourth plurality of transistors coupled in series.

4. The power amplifier system of claim 1 wherein:
the first one of the plurality of switch branches having the first plurality of transistors stacked around the internal node is coupled as a series branch between the first output and the RF output; and
the second one of the plurality of switch branches is a shunt branch coupled between the internal node and the fixed voltage node.

5. The power amplifier system of claim 4 wherein a third one of the plurality of switch branches is coupled between the first output and the fixed voltage node.

6. The power amplifier system of claim 5 wherein:
the second one of the plurality of switch branches comprises a second plurality of transistors stacked in series; and
the third one of the plurality of switch branches comprises a third plurality of transistors stacked in series.

7. The power amplifier system of claim 4 wherein the second one of the plurality of switch branches is coupled to the fixed voltage node through an impedance termination element.

8. The power amplifier system of claim 1 wherein:
the first one of the plurality of switch branches having the first plurality of transistors stacked around the internal node is coupled as a shunt branch between the RF output and the fixed voltage node;
the second one of the plurality of switch branches is a series branch coupled between the second output and the internal node; and
a third one of the plurality of switch branches is a series branch coupled between the first output and the RF output.

9. The power amplifier system of claim 8 wherein:
a fourth one of the plurality of switch branches is coupled between the first output and the fixed voltage node; and
a fifth one of the plurality of switch branches is coupled between the second output and the fixed voltage node.

10. The power amplifier system of claim 8 further including a digital switch controller configured to switch on and off a first section of the first plurality of transistors on one side of the internal node and independently switch on and off a second section of the first plurality of transistors on an opposed side of the internal node.

11. The power amplifier system of claim 1 wherein the first amplifier provides higher power amplification than the second amplifier.

12. The power amplifier system of claim 11 wherein the second amplifier is segmented and biased directly from a battery.

13. The power amplifier system of claim 11 further comprising a reconfigurable input impedance matching network coupled between an RF input, the first input of the first amplifier, the second input of the second amplifier, and the fixed voltage node, wherein the reconfigurable input impedance matching network is digitally controllable to provide selectable shared input impedance matching for both the first amplifier and the second amplifier.

14. The power amplifier system of claim 13 wherein the reconfigurable input impedance matching network comprises at least one impedance matching element that is effectively removable by way of at least one digitally controllable transistorized switch.

15. The power amplifier system of claim 14 wherein the at least one impedance matching element is a capacitor.

16. The power amplifier system of claim 14 wherein the at least one impedance matching element is an inductor.

17. The power amplifier system of claim 13 wherein the reconfigurable input impedance matching network comprises at least one impedance matching element that is selectably shuntable to the fixed voltage node by way of a digitally controllable transistorized switch.

18. The power amplifier system of claim 13 wherein no impedance matching elements are coupled between the second output of the second amplifier and the RF output.

19. The power amplifier system of claim 13 further comprising a signal multiplexer coupled to the RF input, wherein the signal multiplexer has a plurality of signal inputs.

20. A power amplifier system comprising:
a first amplifier having a first input and a first output;
a second amplifier having a second input and a second output; and
a reconfigurable input impedance matching network coupled between an RF input, the first input of the first amplifier, the second input of the second amplifier, and a fixed voltage node, wherein the reconfigurable input impedance matching network is digitally controllable to provide selectable shared input impedance matching for both the first amplifier and the second amplifier, wherein the reconfigurable input impedance matching network comprises at least one impedance matching element that is effectively removable by way of at least one digitally controllable transistorized switch.

21. The power amplifier system of claim 20 wherein the at least one impedance matching element is a capacitor.

22. The power amplifier system of claim 20 wherein the at least one impedance matching element is an inductor.

23. The power amplifier system of claim 20 wherein the reconfigurable input impedance matching network comprises at least one impedance matching element that is selectably shuntable to the fixed voltage node by way of a digitally controllable transistorized switch.

24. The power amplifier system of claim 20 further comprising a reconfigurable switch network coupled between the first output, the second output, the fixed voltage node, and a radio frequency (RF) output, the reconfigurable switch network comprising a plurality of switch branches, wherein at least a first one of the switch branches comprises a first plurality of transistors stacked in series around an internal node to which a second one of the plurality of switch branches is coupled.

25. The power amplifier system of claim 24 wherein:
the first one of the plurality of switch branches having the first plurality of transistors stacked around the internal node is coupled as a series branch between the first output and the RF output; and
the second one of the plurality of switch branches is a series branch coupled between the second output and the internal node.

26. The power amplifier system of claim 25 wherein:
a third one of the plurality of switch branches is coupled between the first output and the fixed voltage node; and
a fourth one of the plurality of switch branches is coupled between the second output and the fixed voltage node.

27. The power amplifier system of claim 26 wherein:
the second one of the plurality of switch branches comprises a second plurality of transistors stacked in series;
the third one of the plurality of switch branches comprises a third plurality of transistors stacked in series; and
the fourth one of the plurality of switch branches comprises a fourth plurality of transistors coupled in series.

\* \* \* \* \*